United States Patent
Hua

(10) Patent No.: US 7,776,651 B2
(45) Date of Patent: Aug. 17, 2010

(54) METHOD FOR COMPENSATING FOR CTE MISMATCH USING PHASE CHANGE LEAD-FREE SUPER PLASTIC SOLDERS

(75) Inventor: Fay Hua, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/073,277

(22) Filed: Mar. 4, 2005

(65) Prior Publication Data

US 2005/0153523 A1     Jul. 14, 2005

Related U.S. Application Data

(62) Division of application No. 10/404,695, filed on Mar. 31, 2003, now abandoned.

(51) Int. Cl.
*H01L 21/00* (2006.01)
(52) U.S. Cl. .............. 438/109; 438/107; 438/108; 438/612; 438/613
(58) Field of Classification Search ......... 438/107–109, 438/612–613
See application file for complete search history.

(56) References Cited

U.S. PATENT DOCUMENTS

| | | | |
|---|---|---|---|
| 5,242,658 A | 9/1993 | Stevens et al. | |
| 5,256,370 A | 10/1993 | Slattery et al. | |
| 5,429,689 A | 7/1995 | Shangguan et al. | |
| 5,538,686 A | 7/1996 | Chen et al. | |
| 5,658,528 A | 8/1997 | Ninomiya et al. | |
| 5,985,212 A | 11/1999 | Hwang et al. | |
| 6,518,089 B2 * | 2/2003 | Coyle ........................ | 438/106 |
| 6,521,176 B2 | 2/2003 | Kitajima et al. | |
| 6,555,052 B2 | 4/2003 | Soga et al. | |
| 6,803,663 B2 * | 10/2004 | Hashimoto ................. | 257/777 |
| 2001/0026955 A1 * | 10/2001 | Briar ......................... | 438/106 |
| 2002/0142517 A1 | 10/2002 | Maeda et al. | |

(Continued)

FOREIGN PATENT DOCUMENTS

CN     1400081 A     3/2003

(Continued)

OTHER PUBLICATIONS

Suganuma, K. et al.; Microstructure and Strength of Interface Between Sn-Ag Eutectic Solder and Cu; J. Japan Inst. Metals C59 (1995), 1 299-1305, p. 1 of 1 (*Abstract*).

(Continued)

*Primary Examiner*—Kevin M Picardat
*Assistant Examiner*—Bac H Au
(74) *Attorney, Agent, or Firm*—Blakely, Sokoloff, Taylor & Zafman LLP

(57) ABSTRACT

Lead-free solders comprising 85-96% tin (Sn) and 4-15% Indium (In) by weight percentage (wt. %) and exemplary uses of the same are disclosed. The Sn—In solder undergoes a martensitic phase change when it is cooled from a reflow temperature to room temperature. As a result, residual stresses that would normally occur due to solder strain caused by relative movement between joined components are substantially reduced. Typically, the relative movement results from a coefficient of thermal expansion (CTE) mismatch between the joined components. The disclosed exemplary uses include flip-chip assembly and IC package to circuit board mounting, such as ball grid array packages.

11 Claims, 4 Drawing Sheets

U.S. PATENT DOCUMENTS

| | | | |
|---|---|---|---|
| 2003/0007886 A1 | 1/2003 | Hwa et al. | |
| 2003/0021718 A1* | 1/2003 | Munekata et al. | 420/560 |
| 2003/0143104 A1 | 7/2003 | Kitajima et al. | |
| 2003/0168130 A1* | 9/2003 | Shohji | 148/403 |
| 2004/0129764 A1* | 7/2004 | Dong | 228/245 |
| 2004/0141873 A1* | 7/2004 | Takemoto et al. | 420/557 |
| 2004/0188503 A1 | 9/2004 | Hua | |

FOREIGN PATENT DOCUMENTS

| | | |
|---|---|---|
| EP | 0 568 952 A1 | 11/1993 |
| EP | 0 710 521 A1 | 5/1996 |
| EP | 1 163 971 A1 | 12/2001 |
| JP | 61-269998 | 11/1986 |
| JP | 02217193 | 8/1990 |
| JP | 3201554 | 9/1991 |
| JP | 9256085 | 9/1997 |
| JP | 10314980 | 12/1998 |
| JP | 2000141078 | 5/2000 |
| JP | 2000190090 | 7/2000 |
| JP | 2001024021 | 1/2001 |
| JP | 2002-076606 | 3/2002 |
| KR | 10-0346606 | 12/2002 |
| TW | 498009 B | 8/2002 |
| TW | 528638 B | 4/2003 |
| WO | PCT/US2004/003385 | 8/2004 |
| WO | WO 2004/094097 A1 | 11/2004 |
| WO | WO 2005/006361 A2 | 1/2005 |

OTHER PUBLICATIONS

Kang, Sung K. et al.; Formation of $Ag_3Sn$ Plates in Sn-Ag-Cu Alloys and Optimization of Their Alloy Composition; pp. 1-8., Samsung Advanced Institute of Technology, Suwon, Korea.

Salam, B. et al.; Study of the Interface Microstructure of Sn-Ag-Cu Lead-Free Solders and the Effect of Solder Volume On Intermetallic Layer Formation; *IEEE 2001 Electronic Components and Technology Conference*, 0-7803-7038-4/01/$10.00 (c) 2001 IEEE.

Koyama, Y. et al.,; The Simple Hexagonal to β-Sn Martensitic Transition in Sn-(7.0-9.5) at.% In Alloys; ACTA.Metal, vol. 37, No. 2, pp. 597-602, 1989.

Yeh, M.S., "Effects of Indium on the Mechanical Properties of Ternary Sn-In-Ag Solders", Metallurgical and Materials Transactions A, vol. 34A, Feb. 3002, pp. 361-365.

Koyama, Y. et al., "Phase Transformation in Sn-(8.0-9.5) at%In Alloys", Scripta Metallurgica, vol. 18, 1984, pp. 715-717.

PCT/US2005/029163; International Search Report and Written Opinion, filed on Aug. 18, 2005 and date of mailing Jun. 2, 2006.

Hwang, J., "Enviornment-Friendly Electronics: Lead-Free Technology," Binary Systems, Chapter 6. p. 177 and 202-207, Electrochemical Publications LTD 2001.

PCT/US2004/003385, International Preliminary Report on Patentability and Written Opinion of the International Search Authority, dated Oct. 1, 2005.

PCT/US2005/029163, International Preliminary Report on Patentability and Written Opinion, dated Mar. 6, 2007.

Office Action dated Nov. 9, 2007, Chinese Patent Application No. 200480008714.1, filed Feb. 6, 2004.

Office Action dated Jun. 13, 2008, Chinese Patent Application No. 200480008714.1, filed Feb. 6, 2004.

Office Action dated Feb. 27, 2008, European Patent Application No. 04 708 990.9—2122, filed Feb. 6, 2004.

Office Action mailed on Oct. 9, 2007, U.S. Appl. No. 10/933,966, filed Sep. 3, 2004.

Office Action mailed on Apr. 17, 2008, U.S. Appl. No. 10/933,966, filed Sep. 3, 2004.

Office Action mailed on Oct. 1, 2008, U.S. Appl. No. 10/933,966, filed Sep. 3, 2004.

Summons to Attend Oral Proceedings dated Feb. 6, 2009, European Application No. 04708990.9, filed Feb. 6, 2004.

Yeh, M.S., "Effects of Indium on the Mechanical Properties of Ternary Sn-In-Ag Solders", Metallurgical and Materials Transactions A, vol. 34A, Feb. 2003, pp. 361-365.

PCT/US2005/029163, International Search Report and Written Opinion, filed on Aug. 18, 2005 and date of mailing Feb. 6, 2006.

Office Action mailed on Sep. 16, 2009, U.S. Appl. No. 10/933,966, filed Sep. 3, 2004, Hua.

* cited by examiner 4-15 wt.% In

● two γ (simple hexagonal) in terms of bco structure

● β-Sn structure(bct) formed by deforming bco to bct

*Raynor and Lee, Acta Metal., 2 (1954) 616

METHOD FOR COMPENSATING FOR CTE MISMATCH USING PHASE CHANGE LEAD-FREE SUPER PLASTIC SOLDERS

CROSS-REFERENCE TO RELATED APPLICATIONS

The present application is a divisional application of U.S. Ser. No. 10/404,695, filed on Mar. 31, 2003, now abandoned the benefit of the filing date of which is claimed under 35 U.S.C. §120.

FIELD OF THE INVENTION

The field of invention relates generally to soldering processes and, more specifically but not exclusively relates to methods for joining components with coefficient of thermal expansion (CTE) mismatches using lead-free super plastic solders.

BACKGROUND INFORMATION

Solders are special composition metals (known as alloys) that, when in the presence of flux, melt at relatively low temperatures (120-450° C.). The most commonly used solders contain tin and lead as base components. Many alloy variations exist that include two or more of the following metallic elements: tin (Sn), lead (Pb), silver (Ag), bismuth (Bi), antimony (Sb) and copper (Cu). Solder works by melting when it is heated, and bonding (wetting) to metallic surfaces. The solder forms a permanent intermetallic bond between the metals joined, essentially acting like a metal "glue." In addition to providing a bonding function, solder joints also provide an electrical connection between soldered components and a heat transfer path. Solders are available in many forms including paste, wire, bar, ribbon, preforms and ingots.

Many high-density integrated circuits (ICs), such as microprocessors, graphics processors, microcontrollers, and the like are packaged in a manner that use of a large number of I/O lines. Common packaging techniques employed for this purpose include "flip chip" packaging and ball grid array (BGA) packages. Both of these packaging techniques employ solder connections (joints) for each I/O line (e.g., pin or ball). In conjunction with the every-increasing density of complex ICs, a corresponding increase in the I/O connection density of flip chip and BGA has occurred. As a result, the solder joints employed in the packages have had to be reduced in size.

More specifically, Flip Chip (FC) is not a specific package (like SOIC), or even a package type (like BGA). Flip chip describes the method of electrically connecting the die to the package carrier. The package carrier, either substrate or leadframe, then provides the connection from the die to the exterior of the package. In "standard" packaging, the interconnection between the die and the carrier is made using wire. The die is attached to the carrier face up, then a wire is bonded first to the die, then looped and bonded to the carrier. Wires are typically 1-5 mm in length, and 25-35 µm in diameter. In contrast, the interconnection between the die and carrier in flip chip packaging is made through a conductive "bump" that is placed directly on the die surface. The bumped die is then "flipped over" and placed face down, with the bumps connecting to the carrier directly. A bump is typically 70-100 µm high, and 100-125 µm in diameter.

The flip chip connection is generally formed one of two ways: using solder or using conductive adhesive. By far, the most common packaging interconnect is solder, high 97Pb-3Sn at die side and attached with eutectic Pb—Sn to substrate. The solder bumped die is attached to a substrate by a solder reflow process, very similar to the process used to attach BGA balls to the package exterior. After the die is soldered, underfill is added between the die and the substrate. Underfill is a specially engineered epoxy that fills the area between the die and the carrier, surrounding the solder bumps. It is designed to control the stress in the solder joints caused by the difference in thermal expansion between the silicon die and the carrier, as described in further detail below. Once cured, the underfill absorbs much of the stress, reducing the strain on the solder bumps, greatly increasing the life of the finished package. The chip attach and underfill steps are the basics of flip chip interconnect. Beyond this, the remainder of package construction surrounding the die can take many forms and can generally utilize existing manufacturing processes and package formats.

Recently, the European Union has mandated that no new products sold after May 31, 2003 contain lead-based solder. Other counties and regions are considering similar restrictions. This poses a problem for manufactures of IC products, as well as for other industries that employ soldering processes during product manufacture. Although many Pb-free solders are well-known, these solders have properties that make them disadvantageous when compared with lead-based solders, including reduction in ductility (plasticity). This is especially problematic in flip-chip and BGA assembly processes.

Owing to active R & D efforts, substantial progress toward a full transition to Pb-free soldering technology has been made recently. At present, the leading candidate solders are near-ternary eutectic Sn—Ag—Cu alloys for various soldering applications. The near-eutectic ternary Sn—Ag—Cu alloys yield three phases upon solidification, β-Sn, $Ag_3Sn$ and $Cu_6Sn_5$. During solidification, the equilibrium eutectic transformation is kinetically inhibited. While the $Ag_3Sn$ phase nucleates with minimal undercooling, the β-Sn phase requires a typical undercooling of 15 to 30° C. for nucleation. As a consequence of this disparity in the required undercooling, large, plate-like $Ag_3Sn$ structures can grow rapidly within the liquid phase, during cooling, before the final solidification of solder joints. When large $Ag_3Sn$ plates are present in solder joints, they may adversely affect the mechanical behavior and possibly reduce the fatigue life of solder joints by providing a preferential crack propagation path along the interface between a large $Ag_3Sn$ plate and the β-Sn phase. Further problems common to Sn—Ag—Cu solders include ILD (inner layer dielectric) cracking and pad peel off at the substrate for flip chip assemblies, and pad peel off at the BGA side for BGA packages.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIGS. 1a-1c are cross-section views illustrating a conventional flip-chip assembly process, wherein FIG. 1a illustrates a condition at a solder reflow temperature, FIG. 1b illustrates a condition after the assembly has cooled, and FIG. 1c illustrates a condition after an underfill is added and a cap is molded over the assembly;

DETAILED DESCRIPTION OF PREFERRED EMBODIMENTS

Details of lead-free solder compositions and exemplary uses for the solders are described herein. In the following description, numerous specific details are set forth, such as implementing the lead-free solder for flip-chip packaging, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
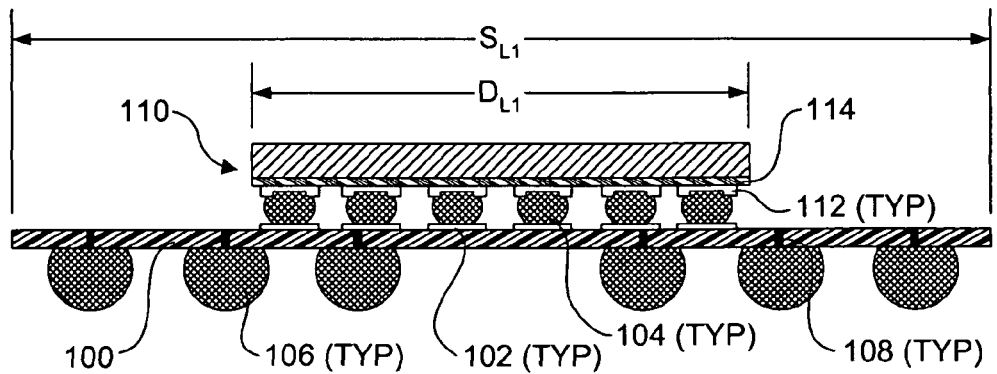
Figure 1B:
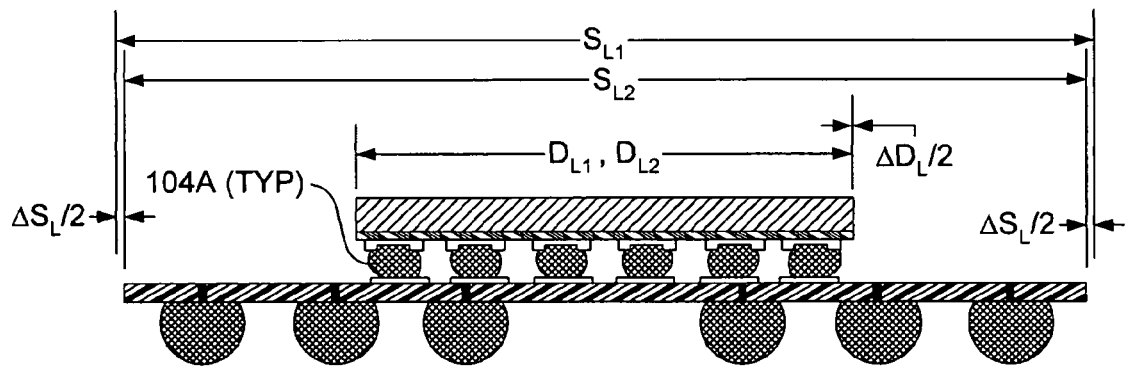

With reference to FIGS. 1a and 1b, a typical flip-chip assembly includes a substrate 100 having a plurality of pads 102 on which respective solder bumps 104 are formed. Substrate 100 further includes a plurality of solder balls 106 coupled to its underside. Respective leads 108 are routed between each pad 102 and solder ball 106. An integrated circuit die 110 is "flip-chip" mounted to substrate 100 by means of solder bumps 104. To facilitate electronic connections to the die circuitry, die 110 includes a plurality of pads 112 mounted to it underside, each of which are connected to a respective portion of the die circuitry via electrical lines (not shown) passing through an inner layer dielectric (ILD) 114. The ILD typically comprises a dielectric layer that is formed over the die substrate, such as silicon dioxide for a silicon die substrate.

The flip-chip components are assembled by raising the temperature of the solder bumps until the solder's reflow temperature is reached, causing the solder bumps to melt. This is typically performed in a reflow oven or the like. Subsequently, the assembled components are cooled, resulting in reversion of the solder back to its solid state, thereby forming a metallic bond between pads 102 and 112.

Typically, the substrate will be formed of a rigid material, such as a rigid laminate. Meanwhile, the die and inner layer dielectric is typically formed from a semiconductive substrate, such as silicon. Silicon has a typical coefficient of thermal expansion (CTE) of 2-4 parts per million (ppm) per degree Celsius. The CTE for a typical flip-chip substrate is approximately 16-19 ppm/° C. This difference in CTE's leads to induced stresses in the solder bumps and inner layer dielectric, as follows.

At the reflow temperature, the substrate and die have respective relative length $L_{S1}$ and $L_{D1}$ in accordance with that shown in FIG. 1a. As the assembly is cooled, the relative lengths are reduced, as shown by lengths $L_{S2}$ and $L_{D2}$ in FIG. 1b. The respective reductions in length are depicted as $\Delta L_S$ and $\Delta L_D$, wherein $\Delta L_D$ is shown as substantially 0 for clarity. Since the CTE for the die is much less than the CTE for the substrate, $\Delta L_S$ is much greater than $\Delta L_D$.

As a result of the CTE mismatch, solder bumps 104 are caused to elongate, as shown by solder bumps 104A in FIG. 1b. For example, consider the configuration of the solder bumps when the assembled components are cooled to a temperature just below the reflow temperature. At this point, the length of the components is substantially the same as that for the reflow configuration of FIG. 1a. The solder is in a solid state, although it is fairly ductile due to the elevated temperature. The solidified solder of each solder bump adheres to respective pairs of pads 102 and 112. As the cooling of the components continues, the length of substrate 100 is reduced by a greater amount than the length of die 110. As a result, the solder bumps are caused to be elongated (strained), inducing a stress in the solder material. Additionally, a portion of the stress is transferred through pads 112 to ILD 114.

During operation, die 110 generates heat in correspondence with resistance losses in its circuitry. As a result, the temperature of the die, as well as nearby thermally-coupled components including substrate 100, increase. When the die circuitry is operating under a high workload condition, its temperature is higher, while lower workload operations result in a lower temperature, and of course no operation results in a still lower temperature. As a result, operation of the die circuitry induces thermal cycling and corresponding stress cycling on the solder bumps due to the CTE mismatch. This in turn may lead to failure conditions, such as pad peel off and ILD cracking.

Figure 1C:
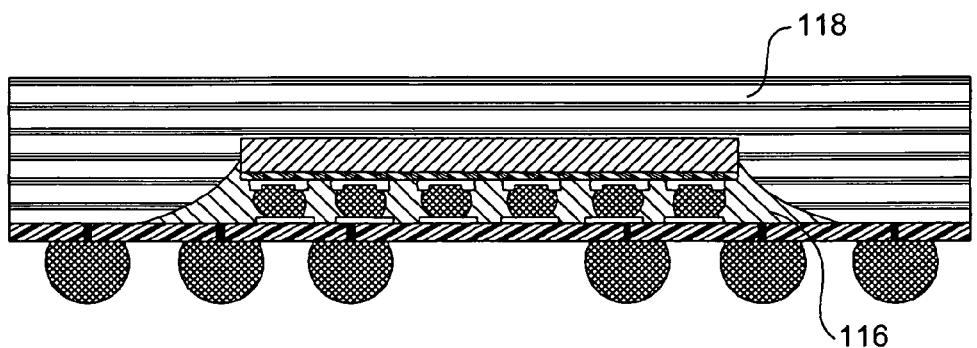

One technique commonly used to reduce the thermal cycling stress-related failures is to fill the volume proximate to solder bumps 104 with an epoxy underfill 116, as shown in FIG. 1c. The packaging process is usually then completed by molding a cap 118 over the top of the various assembly components. When an underfill is employed in this manner, the stress load is placed across the cross section of the combination of the solder bump/pad interfaces and the underfill rather than just the solder bump/pad interfaces alone. This reduces the stress on the bulk solder and solder bump/pad interfaces to some degree, but doesn't entirely remove the stress. More importantly, the residual stress built into the solder bumps (which is concurrently transferred to the solder bump/pad interfaces) as a result of the initial cooling from reflow to room temperature remains the same, since the underfill is not added until after the components have cooled.

Under prior manufacturing techniques, solder bumps 104 would typically comprise a lead-based solder, such as those discussed above. Such solders generally exhibit good plasticity (are very ductile) throughout the temperature ranges the package components are typically expose to. As a result, failure due to pad peel-off and ILD cracking are fairly uncommon.

However, the use of lead-based solders is not a viable option henceforth for many manufactured products, such as products designated for sale to EU countries. Thus, the solder bumps for these products must comprise a lead-free material. As discussed above, Sn—Ag—Cu alloys have become the leading candidate solders for replacing lead-based solders.

This leads to a problems in many applications, since Sn—Ag—Cu solders do not exhibit good plasticity when compared with lead-based solders, leading to the failure modes discussed above.

In accordance with principles of the invention, a lead-free solder compound with super plasticity is now disclosed. In one embodiment, the lead-free solder comprises a Sn—In alloy, wherein the weight % ratio, wt. % is 4-15% Indium (85-96 wt. % Sn). The super plasticity is due to a phase change in the Sn—In alloy as it is cooled from its reflow temperature to room temperature. This phase change dramatically reduces the residual stress problem associated with flip-chip assemblies and the like.

Figure 2:
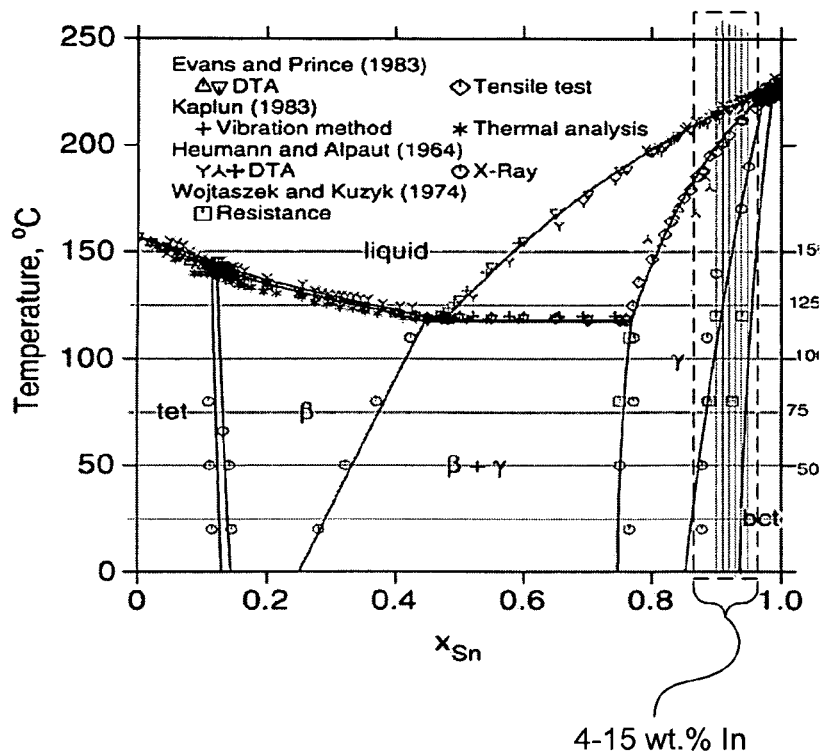
FIG. 2 is a phase diagram corresponding to an Sn—In alloy.

FIG. 2 is phase diagram of Sn—In alloy system. When the ratio of In to Sn is 4-15% wt. %, there is a high temperature packed hexagonal γ phase to lower temperature β-Sn bct (body-centered tetragonal) transition. It has been demonstrated that the phase transformation can happen as a Martensite transformation (Y. Koyama, H.suzuki and O. Nittono, Scripta Metallurgica, vol. 18, pp. 715-717, 1984). It has been realized by the inventor that this Martensite transformation is an advantageous feature of 4-15% wt. % Sn—In alloys with regard to it use for solder joints. More specifically, in accordance with the Martensite transformation, the bulk solder will elongate in a manner that compensates for the CTE mismatch between joined components, such as a die and substrate, with minimum introduction of stress in the solder joints. Furthermore, a reduction in the stress in the inner layer dielectric will also result. These improved solder characteristics lead to increased package reliability.

Figure 3:
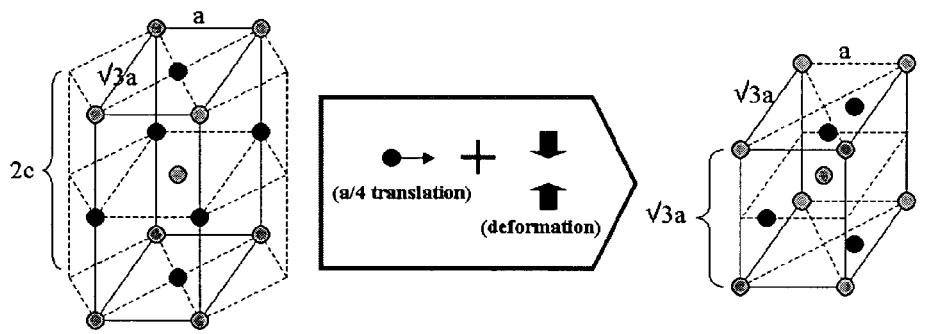
FIG. 3 is a schematic diagram illustrating a change in lattice structure for an Sn—In alloy as it cooled from a high temperature to a low temperature.

A schematic diagram illustrating the phase change at the molecular level is shown in FIG. 3. At higher temperature, the Sn—In alloy lattice structure corresponds to the packed hexagonal γ phase bco (body-centered orthorhombic) structure 300. In this structure, the corners of each plane are alternately occupied by Sn atoms 302 (light colored) and In atoms 304 (dark colored). The atoms are separated along one planel axis by a distance "a" and along the other planel axis by a distance of √3a. The planes are separated by a distance "c"; thus the distance between Sn planes is 2c. As the alloy cools, a phase transformation from γ phase bco structure 300 to a β-Sn bct (body-centered tetragonal) structure 306 occurs. This results from a translation of In atoms relative to the Sn atoms of a/4. At the same time, the distance between the planes is decreased, such that the distance between two Sn planes is reduced to √3a. This results in a shortening of the lattice structure in one direction, and a lengthening in a perpendicular direction.

Figure 4:
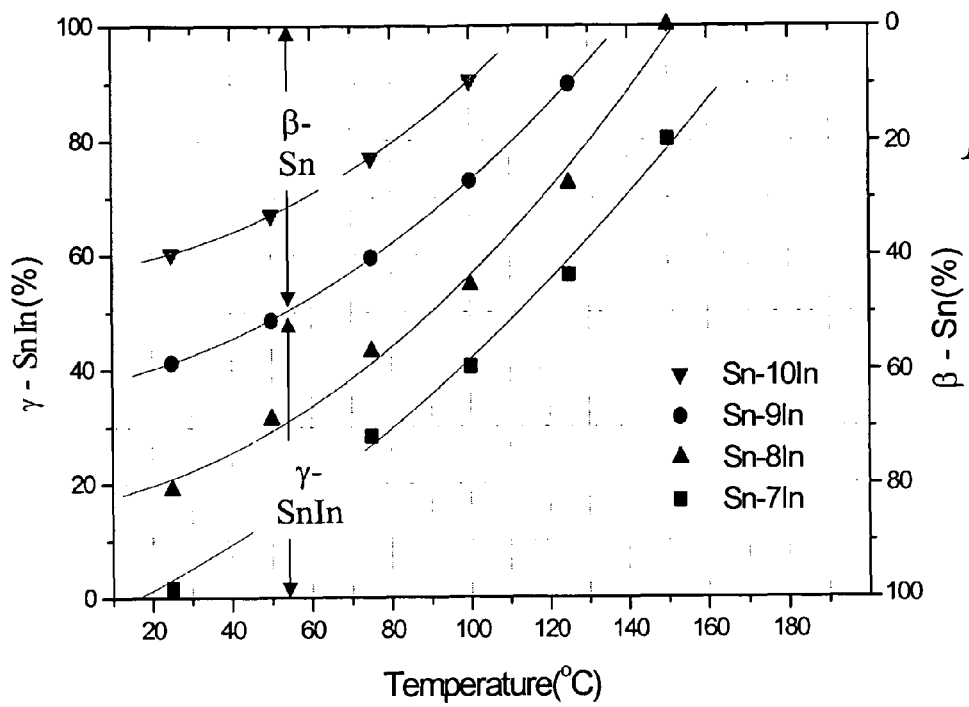
FIG. 4 is a graph illustrating relative percentage of the phase change vs. temperature and Sn—In weight ratios.

FIG. 4 shows the phase-transformation behavior of several Sn—In alloys over a normal cooling range. As the temperature is lowered, more γ bco phase transfers to β-Sn bct phase. It is further noted that as the wt. % In is decreased, the percentage of phase transformation at a given temperature increases. As a result, the plasticity behavior of a particular Sn—In alloy can be tailored to suit a targeted application in which it is to be used.

Further aspects of the invention relate to a Martinsite transformation that occurs when the alloy is cooled. In general, Martinsite and "martensitic" transformations concern diffusionless crystallographic changes that are used to change the material properties of alloys. German metallographier A. Martens was the first to identify such a crystallographic change in iron-carbon steels, and thus Martensite is named after him.

Depending on the type of martensitic transformation, which is generally dependent upon the alloyed elements and/or heat treatment parameters, martensitic transformation form plates, needles, or leaf-like structures in the new phase. The Martensite structures change the material properties of the alloy. For example, it common to heat-treat steels to form Martensite on wear surfaces, such as knives and the like. Under this type of use, the martensitic structure comprises a hardened material at the surface of the steel that is very wear-resistant. Although increased hardness is often beneficial, a downside is a loss in ductility: martensitic steels are generally classified as brittle materials (when compared with non-martensitic phases of corresponding steel alloy, such as annealed steel).

Although martensitic steels exhibit brittle (i.e., non-ductile) behavior, other martensitic alloys exhibit substantially different behaviors, including super plasticity. For example, some memory metals (i.e., a class of metals that can be deformed and returned to their undeformed shape) employ a martensitic phase. In this instance, the metallurgical reason for the Martensite deformability is considered to be the "twinned" structure of the phase: the twin boundaries can be moved without much force and without formation of dislocations, which are typically considered to initiate material fracture.

A further advantage of this structure is the material is not prone to strain hardening, which leads to a decrease in ductility over time as a material is exposed to strain cycling. Such cycling occurs as a result of the temperature cycling of the die in the foregoing flip-chip application. Thus, a conventional solder becomes hardened over time, leading to the formation of fatigue cracking and eventual joint failure.

Figure 5:
FIG. 5 is a microscopic scan illustrating formation of Martensite for an Sn-7In allow that is air cooled.
Figure 6:
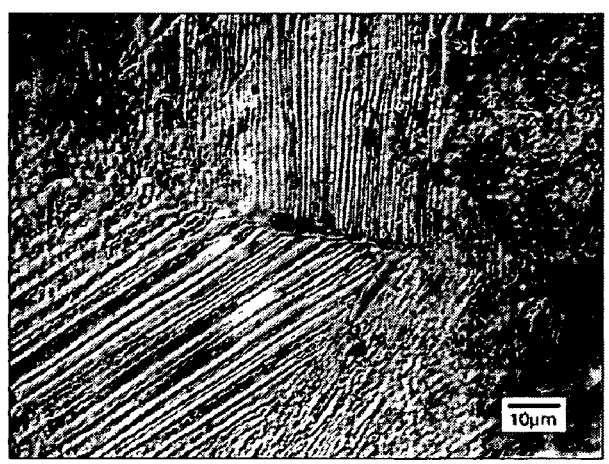
FIG. 6 is a microscopic scan illustrating results of a martensitic phase transformation for Sn-9In that was formed under a compression stress.

Details of microscopic structures that result from martensitic phase transformations are shown in FIGS. 5 and 6. FIG. 5 shows a microscopic scan of an Sn-7 In (i.e., 7 wt. % In) alloy that has been exposed to air cooling. Note the "needle"-like structure shown in the central portion of the scan. FIG. 6 shown a result of a martensitic phase transformation for Sn-9In that was formed under a compression stress. In this case, the direction of the martensitic structure coincides with the material strain.

Figure 7:
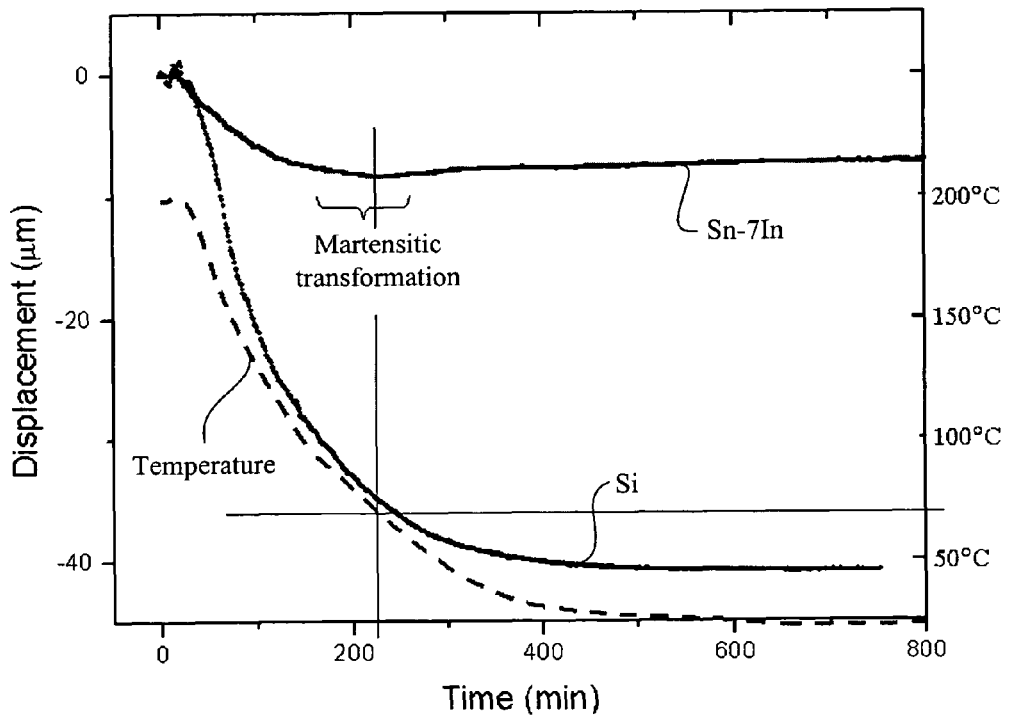
FIG. 7 is a graph illustrating displacement characteristics of Silicon (Si) and Sn-7In vs. temperature under a typical cooling rate.

Displacement characteristics of Silicon (Si) and Sn-7In vs. temperature are shown in FIG. 7. As shown in the figure, the relative displacement of Si substantially mirrors the temperature profile, as would be expected with a constant CTE value. Initially, the Sn-7In alloy exhibits a similar proportional behavior, until the temperature is falls through the range of approximately 80-70° C. During this time frame, a martensitic transformation takes place. After the transformation has occurred, the displacement of the Sn-7In alloy remains substantially constant even the temperature continues to be reduced.

The behavior shown in FIGS. 6 and 7 is directly applicable to the flip-chip CTE mismatch problem discussed above. As discussed above, as the assembly is cooled, the CTE mismatch between the die and substrate materials causes a strain to be induced on the solder bumps. This, in turn, results in stresses within the bulk solder material, and more importantly, at the solder bump/pad interfaces. When an Sn—In solder having the weight ratios disclosed herein is used, a martinsitic phase change under stress occurs. Thus, the bulk solder elongates in the direction of the stress as the solder cools, substantially eliminating the residual stress in the solder bumps that result from the CTE mismatch.

The foregoing principles may be applied to other types of solder joints as well. For example, problems similar to the flip-chip CTE mismatch result in joint failures for BGA packages. In this instance, the CTE mismatch is between the package material, typically a ceramic or the like, and the circuit board to which it is attached, typically a multi-layer fiberglass.

In addition to the Sn—In alloy compositions discussed above, these alloys may be altered by adding small amounts of various metals to produce targeted behaviors. For example, small amounts (e.g. <2 wt. %) of Sb, Cu, Ag, Ni, Ge, and Al may be added to further refine the as-cast microstructure and improve thermal stability. The particular wt. % of these metals that is optimal will generally be dependent on the particular application the solder is to be used in. Such factors include solder reflow temperature, plasticity requirements, expected thermal cycling temperature ranges, etc.

The super-plastic solder alloys described herein are not only very ductile, but also resistant to fatigue. Under typical fatigue loading (e.g., cyclical inducement of strain due to temperature cycling), a conventional solder undergoes a change in its structure. This structural change weakens the bulk material over time, eventually leading to failure. In contrast, the deformation of the super-plastic solder alloys due to the phase change mechanism does not cause a similar level of damage to the bulk material. As a result, the super-plastic solder alloys may be successfully employed in application that would normally lead to fatigue failures when implemented with conventional solders.

As discussed above, the super-plastic solders are well-suited for applications in which the joined materials have CTE mismatches. The foregoing discussion of uses of the solders for die to flip-chip substrate bonding and BGA packing are merely exemplary uses of the super-plastic solders. In general, the solders may be employed in bonding solderable materials having CTE mismatches. Further examples of such uses include bonding an integrated heatsink (IHS) to a die. In this instance, solder further performs the function of the thermal interface material used in conventional IHS to die couplings.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method for joining first and second components having mismatched coefficients of thermal expansion (CTE), comprising:
    forming a plurality of solder bumps comprising a lead-free solder on at least one of the first and second components, wherein the lead-free solder is a solder alloy comprising 85-96% tin and 4-15% Indium by weight percentage (wt. %), wherein the lead-free solder alloy comprises at least one element from the following group: Ni and Ge, wherein the combined wt. % of said at least one element is less than 2 percent;
    disposing the first component opposite the second component with the plurality of solder bumps disposed therebetween;
    heating the solder to a reflow temperature; and
    cooling the first and second components to re-solidify the solder to form a plurality of solder joints between the first and second components,
    wherein the solder is caused to deform during cooling as a result of the CTE mismatch of the first and second components, and wherein the solder comprises a composition that undergoes a phase transformation when it is cooled from the reflow temperature that reduces residual stress in the solder that would normally appear under the same deformation, wherein the phase transformation comprises a martensitic phase transformation and wherein the rate of cooling is controlled to produce a needle-like Martensite microstructure.

2. The method of claim 1, wherein the first component comprises a semiconductor die and the second component comprises a flip-chip substrate.

3. The method of claim 1, wherein the first component comprises an integrated circuit package and the second component comprises a circuit board.

4. The method of claim 3, wherein the integrated circuit packet comprises a ball grid array (BGA) package.

5. The method of claim 1, further comprising selecting the relative weight percentage of Sn to In based on the level of deformation caused by the CTE mismatch between the first and second components so as to minimize residual stresses in the solder joints.

6. The method of claim 1, further comprising selecting the relative weight percentage of Sn to In based on the level of deformation caused by the CTE mismatch between the first and second components and predicted thermal cycling so as to minimize stresses in the solder joints due to the thermal cycling.

7. The method of claim 1, wherein the lead-free solder alloy is tin (Sn) based, and wherein the martensitic phase transformation transforms a lattice structure of the alloy from a packed hexagonal γ phase bco (body-centered orthorhombic) to a β-Sn bct (body-centered tetragonal) structure.

8. The method of claim 1, further comprising underfilling a volume between the first and second components with an epoxy.

9. The method of claim 1 wherein the lead-free solder is a solder alloy comprising 85-92.9% tin and 7.1-15% Indium by weight percentage.

10. The method of claim 1 wherein the residual stress is reduced by elongation of the solder bumps in the direction of the stress caused by the CTE mismatch.

11. The method of claim 1 wherein the Martensitic phase transformation occurs under a compression stress.

* * * * *